(12) United States Patent
Wang et al.

(10) Patent No.: US 8,618,525 B2
(45) Date of Patent: *Dec. 31, 2013

(54) WORK FUNCTION TAILORING FOR NONVOLATILE MEMORY APPLICATIONS

(75) Inventors: Yun Wang, San Jose, CA (US); Tony Chiang, Campbell, CA (US); Imran Hashim, Saratoga, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 301 days.

This patent is subject to a terminal disclaimer.

(21) Appl. No.: 13/156,624

(22) Filed: Jun. 9, 2011

(65) Prior Publication Data

US 2012/0313069 A1    Dec. 13, 2012

(51) Int. Cl.
*H01L 47/00* (2006.01)

(52) U.S. Cl.
USPC .......... 257/4; 257/1; 257/2; 257/43; 257/537; 257/E45.001; 365/148; 365/175; 365/186

(58) Field of Classification Search
USPC ............... 257/1, 2, 3, 4, 5, 43, 528, 529, 530, 257/536, 537, E27.016, E27.047, E27.071, 257/E45.001, E45.002, E45.003, E29.17, 257/E29.029; 438/104, 900; 365/148, 163, 365/174, 175, 186
See application file for complete search history.

(56) References Cited

U.S. PATENT DOCUMENTS

| | | | |
|---|---|---|---|
| 7,378,719 B2 | 5/2008 | Yang | |
| 7,897,453 B2 * | 3/2011 | Chen et al. | 438/237 |
| 2004/0159828 A1 | 8/2004 | Rinerson | |
| 2009/0268508 A1 | 10/2009 | Chen et al. | |
| 2010/0078758 A1 * | 4/2010 | Sekar et al. | 257/530 |
| 2011/0079764 A1 * | 4/2011 | Nishihara et al. | 257/3 |
| 2011/0194329 A1 * | 8/2011 | Ohba et al. | 365/148 |
| 2012/0178210 A1 * | 7/2012 | Lee et al. | 438/104 |
| 2012/0280199 A1 * | 11/2012 | Takagi | 257/3 |

OTHER PUBLICATIONS

Kim et al.; Anodeinterface localized filamentary mechanism in resistive switching of TiO2 thin films; Jul. 6, 2007; American Institute of Physics; Applied Physics Letters Jul. 6, 2007 pp. 01290710129073 vol. 91.

Xiong, K., et al.; Passivation of Oxygen Vacancy States in HfO2 by Nitroggen; Jan. 1, 2006; Cambridge University; Journal of Applied Physics pp. 99101.

(Continued)

*Primary Examiner* — Eduardo A Rodela

(57) ABSTRACT

Embodiments of the invention generally relate to a resistive switching nonvolatile memory device having an interface layer structure disposed between at least one of the electrodes and a variable resistance layer formed in the nonvolatile memory device, and a method of forming the same. Typically, resistive switching memory elements may be formed as part of a high-capacity nonvolatile memory integrated circuit, which can be used in various electronic devices, such as digital cameras, mobile telephones, handheld computers, and music players. In one configuration of the resistive switching nonvolatile memory device, the interface layer structure comprises a passivation region, an interface coupling region, and/or a variable resistance layer interface region that are configured to adjust the nonvolatile memory device's performance, such as lowering the formed device's switching currents and reducing the device's forming voltage, and reducing the performance variation from one formed device to another.

11 Claims, 8 Drawing Sheets

(56) References Cited

OTHER PUBLICATIONS

Choi, K., et al.; Initial Growth of Interfacial Oxide During Deposition of HfO2 on Silicon; Jul. 12, 2004; Texas Tech University; Applied Physics Letters vol. 85 No. 2 pp. 215218.

Netzer, F.; Interfacial Oxide Layers at the MetalOxide Phase Boundary; Jan. 1, 2002; World Scientific Publishing Company; Surface Review and Letters vol. 9 Nos. 3 and 4 pp. 15531563.

Fillot, F., et al.; Investigations of the Interface Stability in HfO2Metal Electrodes; Jan. 1, 2003; STM-AMAT; Microelectronic Engineering pp. 384391.

* cited by examiner

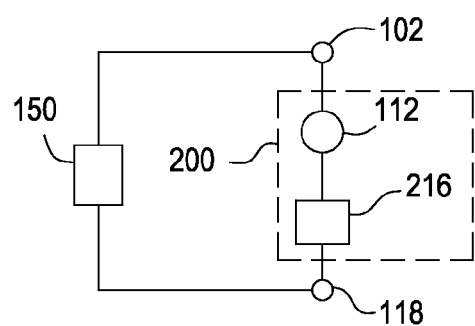
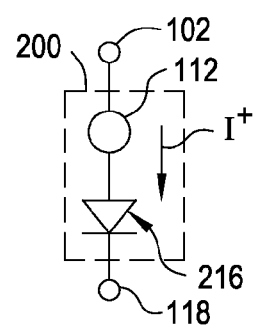
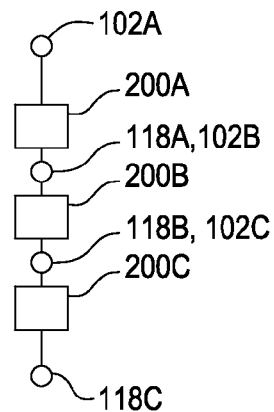
FIG. 2A  FIG. 2B  FIG. 2C
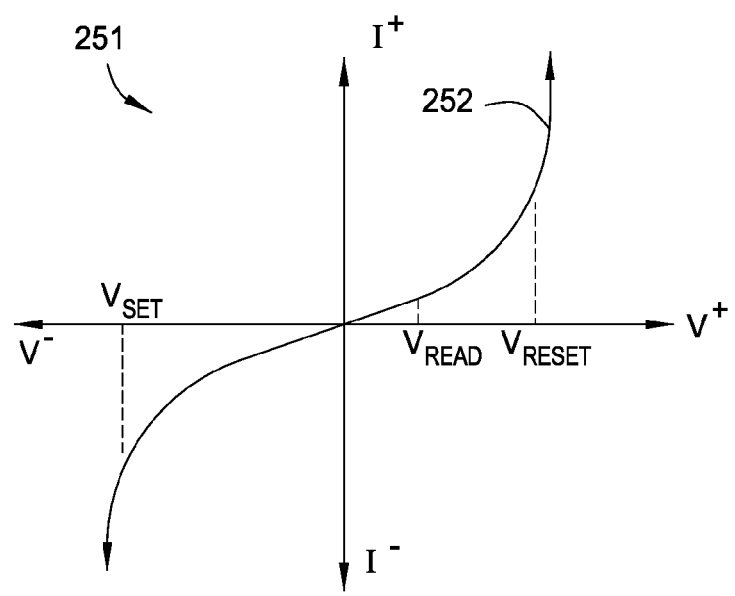
FIG. 2D

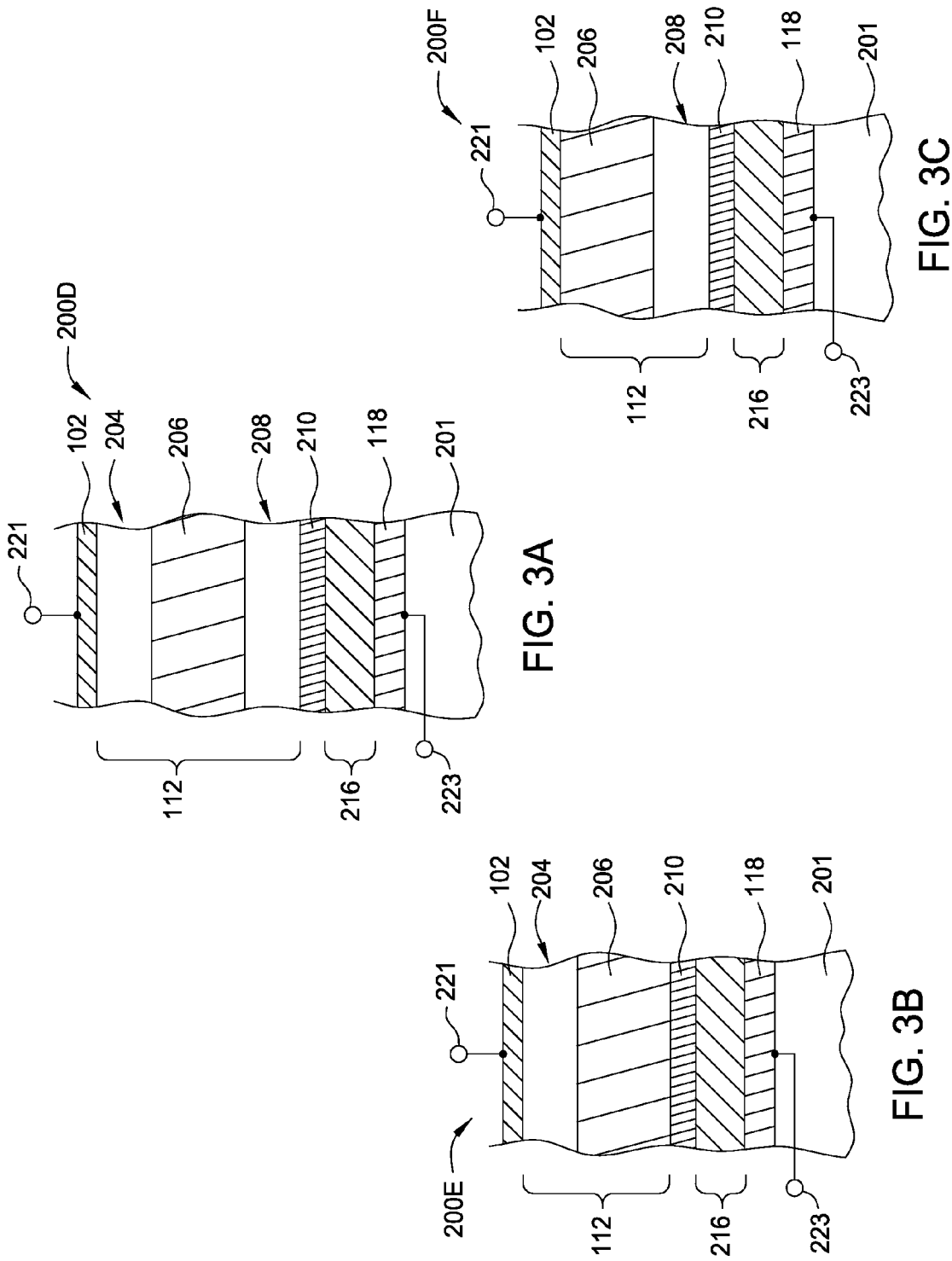

WORK FUNCTION TAILORING FOR NONVOLATILE MEMORY APPLICATIONS

BACKGROUND OF THE INVENTION

1. Field of the Invention

This invention relates to nonvolatile memory elements, and more particularly, to methods for forming resistive switching memory elements used in nonvolatile memory devices.

2. Description of the Related Art

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide (MO) films has been demonstrated. Although metal oxide (MO) films such as these exhibit bistability, the resistance of these films and/or the ratio of the high-to-low resistance states is (are) often insufficient to be of use within a practical nonvolatile memory device. For instance, the resistance states of the metal oxide film should preferably be significant as compared to that of the system (e.g., the memory device and associated circuitry) so that any change in the resistance state change is perceptible. Since the variation in the difference between the high and low resistive states is related to the resistance of the resistive switching layer, it is often hard to use a low resistance metal oxide film to form a reliable nonvolatile memory device. For example, in a nonvolatile memory that has conductive lines formed of a relatively high resistance metal such as tungsten, the resistance of the conductive lines may overwhelm the resistance of the metal oxide resistive switching element. This may make it difficult or impossible to sense the state of the bistable metal oxide resistive switching element. Similar issues can arise from integration of the resistive switching memory element with current steering elements, such as diodes and/or resistors. The resistance of the resistive switching memory element (at least in its high resistance state) is preferably significant compared to the resistance of the current steering elements, so that the unvarying resistance of the current steering element does not dominate the resistance of the switching memory element, and thus reduce the measurable difference between the "on" and "off" states of the formed memory device (i.e., logic states of the device). However, since the power that can be delivered to a circuit containing a series of resistive switching memory elements and current steering elements is typically limited in most conventional nonvolatile memory devices (e.g., CMOS driven devices), it is desirable to form each of the resistive switching memory elements and current steering elements in the circuit so that the voltage drop across each of these elements is small, and thus resistance of the series connected elements does not cause the current to decrease to an undesirable level due to the fixed applied voltage (e.g., ~2-5 volts).

As nonvolatile memory device sizes shrink, it is important to reduce the required currents and voltages that are necessary to reliably set, reset and/or determine the desired "on" and "off" states of the device to minimize resistive heating of the device and cross-talk between adjacent devices. Moreover, in cases where multiple formed memory devices are interconnected to each other and to other circuit elements it is desirable to minimize the device performance variation between one device to the next to assure that the performance of the formed circuit performs in a desirable manner.

Therefore, it is desirable to form a nonvolatile memory device that has a low operating current and reduced device performance variability.

SUMMARY OF THE INVENTION

Embodiments of the invention generally relate to a resistive switching nonvolatile memory device having an interface layer structure disposed between at least one of the electrodes and a variable resistance layer formed in the nonvolatile memory device. The resistive switching memory elements may be formed as part of a high-capacity nonvolatile memory integrated circuit, which can be used in various electronic devices, such as digital cameras, mobile telephones, handheld computers, and music players. The resistive switching nonvolatile memory device, comprises a passivation region, an interface coupling region, and/or a variable resistance layer interface region that are configured to adjust the nonvolatile memory device's performance, such as lowering the formed device's switching currents and reducing the device's forming voltage, and reducing the performance variation from one formed device to another.

The present invention may provide a nonvolatile memory element, comprising a first electrode layer, a second electrode layer, a variable resistance layer disposed between the first electrode layer and the second electrode layer, and a first interface layer disposed between the first electrode layer and the variable resistance layer, wherein the first interface layer comprises, a first passivation region disposed adjacent to the first electrode, and a first variable resistance interface region disposed adjacent to the variable resistance layer. In one example, the first electrode layer comprises a first material selected from a group consisting of titanium, aluminum, tungsten, tantalum, cobalt, molybdenum, nickel, vanadium, copper, platinum, palladium, iridium and ruthenium, and the first passivation region comprises the first material found in the first electrode layer and a second material selected from a group consisting of titanium, aluminum, tungsten, tantalum, cobalt, molybdenum, nickel, vanadium, copper, platinum, palladium, iridium, and ruthenium, wherein the first material and the second material are different materials.

Embodiments of the present invention may further provide a nonvolatile memory element, comprising a first electrode layer, a second electrode layer, a variable resistance layer disposed between the first electrode layer and the second electrode layer, a first interface layer disposed between the first electrode layer and the variable resistance layer, wherein the first interface layer comprises a first passivation region disposed adjacent to the first electrode layer, and a first variable resistance interface region disposed adjacent to the variable resistance layer, and a second interface layer disposed between the second electrode layer and the variable resistance layer, wherein the second interface layer comprises a second passivation region disposed adjacent to the second electrode layer, and a second variable resistance interface region disposed adjacent to the variable resistance layer.

Embodiments of the present invention may further provide a method of forming a nonvolatile memory element, comprising forming a first electrode layer comprising a first electrode material over a surface of a substrate, forming a first interface layer comprising a first interface material, wherein the first interface layer is in contact with the first electrode layer, forming a second interface layer comprising a second interface material, forming a variable resistance layer comprising a variable resistance material, wherein the second interface layer is in contact with variable resistance layer and is disposed between the first interface layer and the variable resistance layer, and heating the substrate to (a) form a first interface region that comprises the first interface material and the first electrode material, wherein the material in the first interface region has a work function greater than the work function of the first electrode material, and (b) form a second interface region that comprises the second interface material and the variable resistance material.

Embodiments of the present invention may further provide a method of forming a nonvolatile memory element, comprising forming a first electrode layer comprising a first electrode material over a surface of a substrate, forming a first interface layer comprising a first interface material, wherein the first interface layer is in contact with the first electrode layer, forming a second interface layer comprising a second interface material, forming a variable resistance layer comprising a variable resistance material, wherein the variable resistance layer is in contact with the second interface layer, and heating the substrate to a temperature between about 550° C. and about 1000° C. for a period of time between about 30 seconds and about 20 minutes at least once to form a first interface region that comprises the first interface material and the first electrode material, wherein the material in the first interface region has a work function greater than the work function of the first electrode material, and form a second interface region that comprises the second interface material and the variable resistance material.

Embodiments of the present invention may further provide a nonvolatile memory element, comprising a first electrode layer comprising a first electrode material, a second electrode layer comprising a second electrode material, a variable resistance layer comprising a variable resistance material disposed between the first electrode layer and the second electrode layer, and a first interface layer disposed between the first electrode layer and the variable resistance layer, and comprising a first dielectric material that has a band gap greater than the band gap of the variable resistance material.

Embodiments of the present invention may further provide a nonvolatile memory element, comprising a first electrode layer, a second electrode layer, a variable resistance layer comprising a variable resistance material disposed between the first electrode layer and the second electrode layer, a first interface layer disposed between the first electrode layer and the variable resistance layer, and comprising a first dielectric material that has a band gap greater than the band gap of the variable resistance material, and a second interface layer disposed between the second electrode layer and the variable resistance layer, and comprising a second dielectric material that has a band gap greater than the band gap of the variable resistance material.

Embodiments of the present invention may further provide a method of forming a nonvolatile memory element, comprising forming a first electrode layer comprising a first electrode material over a surface of a substrate, forming a first interface layer comprising a first interface material, wherein the first interface layer is in contact with the first electrode layer, forming a second interface layer comprising a second interface material over the first interface layer, forming a third interface layer comprising a third interface material over the second interface layer, forming a variable resistance layer comprising a variable resistance material, wherein the third interface layer is in contact with the variable resistance layer, and the first, second or third interface materials have a band gap that is larger than the band gap of the variable resistance material, and heating the substrate to (a) form a first interface region that comprises the first interface material and the first electrode material, wherein the material in the first interface region has a work function greater than the work function of the first electrode material, and (b) form a second interface region that comprises the second interface material and the variable resistance material.

Embodiments of the present invention may further provide a method of forming a nonvolatile memory element, comprising forming a first electrode layer comprising a first electrode material over a surface of a substrate, forming a first interface layer comprising a first interface material, wherein the first interface layer is in contact with the first electrode layer, forming a second interface layer comprising a second interface material, forming a third interface layer comprising a third interface material, forming a variable resistance layer comprising a variable resistance material, wherein the third interface layer is in contact with the variable resistance layer, and the second interface material has a band gap that is larger than the band gap of the variable resistance material, and heating the substrate to a temperature greater than about 550° C. and about 1000° C. for a period of time between about 30 seconds and about 20 minutes at least once to form a first interface region that comprises the first interface material and the first electrode material, wherein the material in the first interface region has a work function greater than the work function of the first electrode material, and form a second interface region that comprises the second interface material and the variable resistance material.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2A is schematic representation of a memory device in accordance with an embodiment of the invention.

FIG. 2B is schematic representation of a memory device having a diode type current steering element in accordance with an embodiment of the invention.

FIG. 2C is schematic representation of an array of memory devices in accordance with an embodiment of the invention.

FIG. 2D is a graph illustrating the current (I) versus voltage (V) characteristics of a bipolar switching type memory element in accordance with an embodiment of the invention.

FIGS. 3A-3C are schematic side cross-sectional views of a nonvolatile memory device in accordance with an embodiment of the invention.

While the foregoing is directed to embodiments of the present invention, other and further embodiments of the invention may be devised without departing from the basic scope thereof, and the scope thereof is determined by the claims that follow.

DETAILED DESCRIPTION

Embodiments of the invention generally relate to a resistive switching nonvolatile memory device having an interface layer structure disposed between at least one of the electrodes and a variable resistance layer formed in the nonvolatile memory device, and a method of forming the same. Typically, resistive switching memory elements may be formed as part of a high-capacity nonvolatile memory integrated circuit, which can be used in various electronic devices, such as digital cameras, mobile telephones, handheld computers, and music players. In one configuration of the resistive switching nonvolatile memory device, the interface layer structure comprises a passivation region, an interface coupling region, and/or a variable resistance layer interface region that are configured to adjust the nonvolatile memory device's performance, such as lowering the formed device's switching currents and reducing the device's forming voltage, and reducing the performance variation from one formed device to another. The use of resistive switching memory elements to form memory arrays is merely illustrative, and one skilled in the art will appreciate that the formed devices may be used in other device applications without deviating from the basic scope of the invention described herein.

Figure 1:
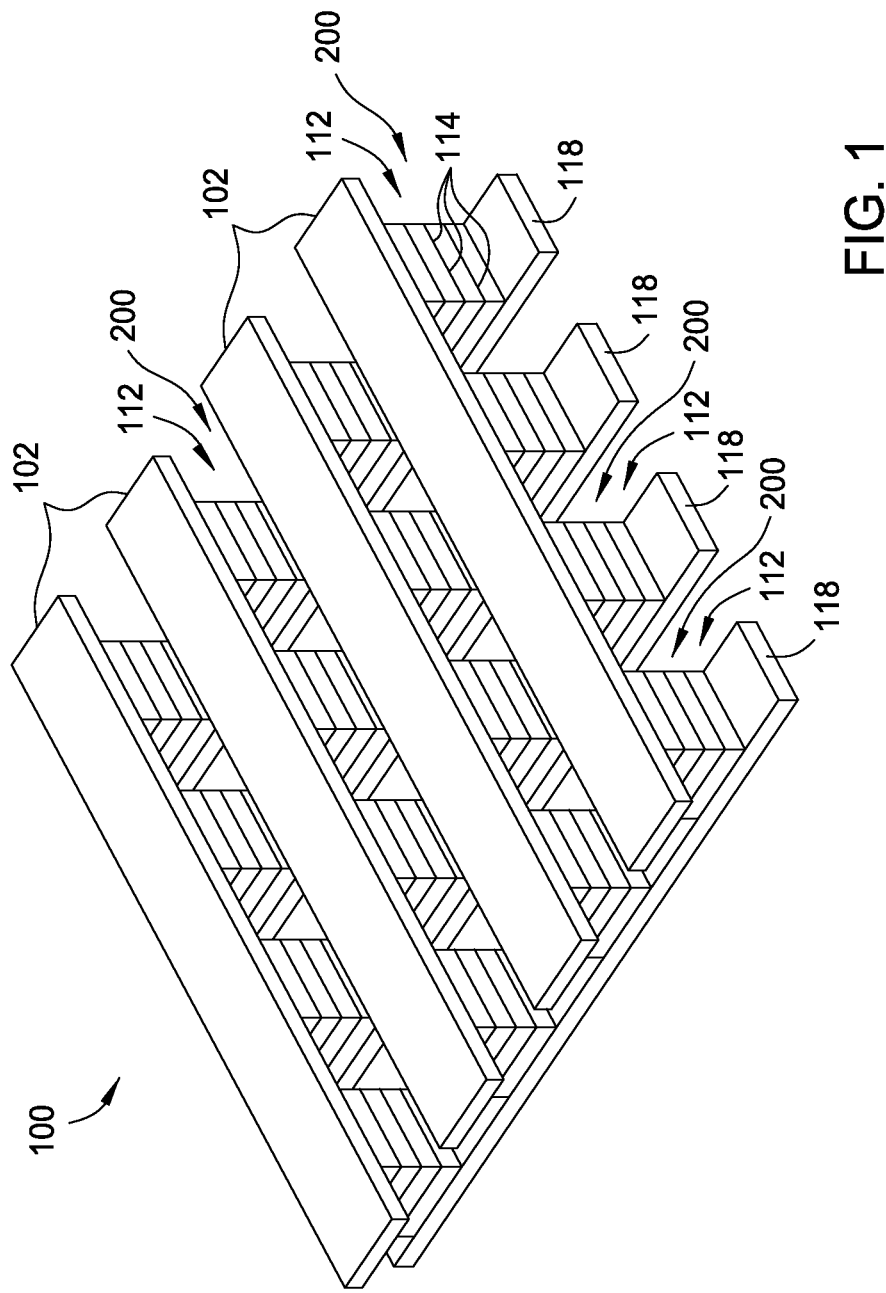
FIG. 1 illustrates an array of resistive switching memory elements in accordance with an embodiment of the invention.

An illustrative memory array 100 of nonvolatile resistive switching memory devices 200, which each generally include at least one switching memory element 112, is illustrated in FIG. 1. Memory array 100 may be part of a larger memory device or other integrated circuit structure, such as a system on a chip type device. Read and write circuitry is connected to switching memory devices 200 using electrodes 102 and orthogonal electrodes 118. Electrodes, such as electrodes 102 and electrodes 118, are sometimes referred to as word lines and bit lines, and are used to read and write data into the memory elements 112 in the switching memory devices 200. Individual switching memory devices 200 or groups of switching memory devices 200 can be addressed using appropriate sets of electrodes 102 and 118. The memory elements 112 in the switching memory devices 200 may be formed from one or more layers 114 of materials, as indicated schematically in FIG. 1. In addition, memory arrays such as memory array 100 can be stacked in a vertical fashion to make multilayer memory array structures.

FIG. 2A schematically illustrates one example of a switching memory device 200 that contains a memory element 112, and an optional current steering device 216, which are disposed between the electrodes 102 and 118. In one configuration, the current steering device 216 is an intervening electrical component, such as a p-n junction diode, p-i-n diode, transistor, or other similar device that is disposed between electrode 102 and memory element 112, or between the electrode 118 and memory element 112. In one example, the current steering device 216 may include two or more layers of semiconductor material, such as two or more doped silicon layers, that are configured to allow or inhibit the current flow in different directions through the memory element 112.

FIG. 2B schematically illustrates a switching memory device 200 that contains a memory element 112 and a diode type current steering device 216 that preferentially allows current to flow through the memory device 200 in a forward direction ("I$^+$"). However, due to the design of the current steering device 216, a reduced current can also flow in the opposing direction through the device by the application of a reverse bias to the electrodes 102 and 118.

FIG. 2C schematically illustrates a series array of switching memory devices 200A-200C that may be connected together to form part of a high-capacity nonvolatile memory integrated circuit. As illustrated in FIG. 2C, each of the switching memory devices 200A-200C may be connected internally in a formed chip package, or externally from a formed chip package, by use of the electrodes 102A-102C and 118A-118C.

During operation, such as a read operation, the state of a memory element 112 in the switching memory device 200 can be sensed by applying a sensing voltage (i.e., a "read" voltage $V_{READ}$ (FIG. 2D)), such as applying about +0.5 volts (V), to an appropriate set of electrodes 102 and 118. Depending on its history, a memory element that is addressed in this way may be in either a high resistance state (HRS) or a low resistance state (LRS). The resistance of the memory element 112 therefore determines what digital data is being stored by the memory element 112. If the memory element 112 is in the high resistance state, for example, the memory element may be said to contain a logic one (i.e., a "1" bit). If, on the other hand, the memory element is in the low resistance state, the memory element may be said to contain a logic zero (i.e., a "0" bit). During a write operation, the state of a memory element can be changed by application of suitable write signals to an appropriate set of electrodes 102 and 118.

In some embodiments, the memory element 112 uses bipolar switching where opposite polarity set and reset voltages are used to alter the resistance of the memory element between high and low resistance states. FIG. 2D schematically illustrates a log-log plot of current (I) versus voltage (V) (e.g., reference numeral 251) of one example of a bipolar switching curve 252 of a resistive switching type of memory element, and thus illustrates typical threshold values used to set and reset the contents of a memory element 112. In one example, initially, memory element 112 may be in a high resistance state (e.g., storing a logic "zero"). The high resistance state of memory element 112 can be sensed by read and write circuitry 150 (FIG. 2A) using electrodes 102 and 118. For example, read and write circuitry may apply a read voltage $V_{READ}$ to memory element 112, and can sense the resulting "off" current ($I_{OFF}$) that flows through memory element 112. When it is desired to store a logic "one" in memory element 112, memory element 112 can be placed into its low-resistance state. This may be accomplished by using read and write circuitry 150 to apply a set voltage $V_{SET}$ (e.g., −2 V to −4 V) across electrodes 102 and 118. In one configuration, applying a negative $V_{SET}$ voltage to memory element 112 causes memory element 112 to switch to its low resistance state. In this region, the memory element 112 is changed so that, following removal of the set voltage $V_{SET}$, memory element 112 is characterized by a low resistance state. It is believed that the change in the resistive state of the memory element 112 may be due to the redistribution or filling of traps (i.e., "trap-mediated"), or defects, in the resistive switching layer (e.g., variable resistance layer 206 (FIG. 3A)) when the device is reverse biased. The defects or traps, which are commonly formed during the deposition and/or post-processing of the variable resistance layer 206, are often created by a non-stoichiometric material composition found in the formed variable resistance layer 206. $V_{SET}$ and $V_{RESET}$ are generally referred to as "switching voltages" herein.

The low resistance state of the memory element 112 can be sensed using the read and write circuitry 150. When a read voltage $V_{READ}$ is applied to resistive switching memory element 112, the read and write circuitry 150 will sense the relatively high "on" current value ($I_{ON}$), indicating that memory element 112 is in its low resistance state. When it is desired to store a logic zero in memory element 112, the memory element can once again be placed in its high resistance state by applying a positive reset voltage $V_{RESET}$ (e.g., +2 V to +5 V) to memory element 112. When read and write circuitry applies $V_{RESET}$ to memory element 112, memory element 112 enters its high resistance state. When the reset voltage $V_{RESET}$ is removed from memory element 112, memory element 112 will once again be characterized by high resistance when the read voltage $V_{READ}$ is applied. Voltage pulses can be used in the programming of the memory element 112. For example, a 1 ms to 1 ns square or trapezoidal shaped pulse can be used to switch the memory element 112. In some embodiments, it may be desirable to adjust the length of the pulse depending on the amount of time needed to switch the memory element 112. By use of one or more of the embodiments described herein, it has been found that the shape and length of the pulse required to program the memory element 112 can be drastically reduced, thus improving the speed with which the memory element 112 can switch logic states. In one example, a more conventionally configured memory element, which does not contain an interface layer structure may require a trapezoidal pulse that had a rise time and fall time of about 40 ns and "on" period of about 500 ns to reliably program the memory element 112, while a memory element having an interface layer structure, as discussed below, only requires a trapezoidal pulse that had a rise time and fall time of about 10 ns and "on" period of about 50 ns. While the discussion of the memory element 112 herein primarily provides bipolar switching examples, some embodiments of the memory elements 112 may use unipolar switching, where the set and reset voltages have the same polarity, without deviating from the scope of the invention described herein.

In an effort to prepare the memory element 112 for use, it is common to apply a forming voltage ($V_{FORM}$) at least once across the electrodes 102, 118 to "burn-in" the device, as briefly discussed above. It is believed that the application of a forming voltage, which is typically significantly greater than the $V_{RESET}$ and $V_{SET}$ voltages, causes the defects that are formed within the variable resistance layer 206 during the device fabrication process to move, align and/or collect within various regions of the layer, causing the VR layer 206 to consistently and reliably switch between the "on" and "off" resistive states throughout the memory element's life. In one configuration, the forming voltage is between about 1 and about 5 times greater than the $V_{RESET}$ or $V_{SET}$ voltage. In one example, the forming voltage is between about 1.4 and about 2.5 times greater than the $V_{RESET}$ or $V_{SET}$ voltage. In one example, the forming voltage is between about 3 and about 7 volts. However, it is noted that in some cases it is desirable to form the memory element 112 so that the application of a forming voltage is not required at all to assure that the device will perform as desired throughout its life.

FIGS. 3A-3C are each schematic side cross-sectional views of a switching memory device 200, such as switching memory devices 200D-200F, that are formed from a series of deposited layers. In one example, as shown in FIGS. 3A-3C the integrated series of layers used to form a switching memory device 200 are formed over, or integrated with and distributed over, portions of a surface of a substrate 201 (e.g., silicon substrate, SOI substrate). In one embodiment, the switching memory device 200 comprises a memory element 112 disposed between an electrode 102 and an electrode 118. In another embodiment, as shown in FIGS. 3A-3C, the switching memory devices 200D-200F each comprise an electrode 102, a memory element 112, optional intermediate electrode 210, an optional current steering device 216 and an electrode 118. It should be noted that, in some configurations, the switching memory device 200 does not contain a current steering device 216. Further, the electrode 118 and the intermediate electrode 210 may both be the same element, or in some cases parts of a larger multilayered electrode element.

Generally, the memory element 112 comprises a variable resistance layer 206 and one or more interface structures, such as a first interface structure 204 and/or a second interface structure 208, which are disposed between the variable resistance layer 206 and an electrode disposed in the switching memory device 200. In one embodiment of a switching memory device, as shown in FIG. 3A, the memory elements 112 comprises a first interface structure 204, a variable resistance layer 206 and a second interface structure 208, wherein the first interface structure 204 is in contact with the electrode 102 and the variable resistance layer 206, and the second interface structure 208 is in contact with the intermediate electrode 210 and the variable resistance layer 206. In another embodiment of a switching memory device, as shown in FIG. 3B, the memory elements 112 comprises a first interface structure 204 and a variable resistance layer 206, wherein the first interface structure 204 is in contact with the electrode 102 and the variable resistance layer 206, and the intermediate electrode 210 is in contact with the variable resistance layer 206. In yet another embodiment of a switching memory device, as shown in FIG. 3C, the memory element 112 comprises a second interface structure 208 and a variable resistance layer 206, wherein the second interface structure 208 is in contact with the intermediate electrode 210 and the variable resistance layer 206, and the electrode 102 is in contact with the variable resistance layer 206.

The variable resistance layer 206 can be a dielectric material, such as a metal oxide material or other similar material that can be switched between at least two or more stable resistive states. In some embodiments, the variable resistance layer 206 is a high bandgap material (e.g., bandgap >4 electron volts (eVs)), such as hafnium oxide (Hf$_x$O$_y$), tantalum oxide (Ta$_x$O$_y$), aluminum oxide (Al$_x$O$_y$), lanthanum oxide (La$_x$O$_y$), yttrium oxide (Y$_x$O$_y$), dysprosium oxide (Dy$_x$O$_y$), ytterbium oxide (Yb$_x$O$_y$) and zirconium oxide (Zr$_x$O$_y$). It has been found that using high band gap variable resistance layer materials will improve data retention in the memory element 112, and reduce the leakage current in the formed memory element device, since the amount of trapped charge in the variable resistance layer material with a high band gap will be less than the amount of trapped charge in the variable resistance layer material with a lower band gap material, and the high band gap materials create a large barrier height that the carriers have to cross during the read, set and reset operations. In other embodiments, lower bandgap metal oxide materials can be used, such as titanium oxide (TiO$_x$), nickel oxide (NiO$_x$) or cerium oxide (CeO$_x$) may be advantageous for some embodiments. In some cases, a semiconductive metal oxide (p-type or n-type) such as zinc oxides (Zn$_x$O$_y$), copper oxides (Cu$_x$O$_y$), and their nonstoichiometric and doped variants can be used. The variable resistance layer 206 may comprise a metal oxide (e.g., HfO$_2$) layer formed to a thickness of between about 10 and about 100 angstroms (Å).

The electrodes 102, 210 and 118 are formed from conductive materials that have a desirable work function. In some configurations, the electrode 102 and 210 are formed from different materials. In some embodiments, the electrodes have a work function that differs by between 0.1 and 1 electron volt (eV), or by between 0.4 and 0.6 eV, etc. For example, the electrode 102 can be TiN, which has a work function of 4.5-4.6 eV, while the electrode 210 can be n-type polysilicon, which has a work function of approximately 4.1-4.15 eV. Other electrode materials, which can be used in electrode 102, electrode 210 and/or electrode 118 include but are not limited to p-type polysilicon (4.9-5.3 eV), n-type polysilicon, transition metals, transition metal alloys, transition metal nitrides, transition metal carbides, tungsten (4.5-4.6 eV), tantalum nitride (4.7-4.8 eV), molybdenum oxide (~5.1 eV), molybdenum nitride (4.0-5.0 eV), iridium (4.6-5.3 eV), iridium oxide (~4.2 eV), ruthenium (~4.7 eV), and ruthenium oxide (~5.0 eV). Other potential electrode materials include a titanium/aluminum alloys (4.1-4.3 eV), nickel (~5.0 eV), tungsten nitride (~4.3-5.0 eV), tungsten oxide (5.5-5.7 eV), aluminum (4.2-4.3 eV), copper or silicon-doped aluminum (4.1-4.4 eV), copper (~4.5 eV), hafnium carbide (4.8-4.9 eV), hafnium nitride (4.7-4.8 eV), niobium nitride (~4.95 eV), tantalum carbide (approximately 5.1 eV), tantalum silicon nitride (~4.4 eV), titanium (4.1-4.4 eV), vanadium carbide (~5.15 eV), vanadium nitride (~5.15 eV), and zirconium nitride (~4.6 eV). In one example, the electrode 102 is a metal, metal alloy, metal nitride or metal carbide formed from an element selected from a group consisting of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), ruthenium (Ru), and combination thereof. In one example, the electrode 102 comprises a metal alloy selected from the group of a titanium/aluminum alloy (Ti$_x$Al$_y$), or a silicon-doped aluminum (AlSi).

The interface structures disposed between the variable resistance layer 206 and one or both of the electrodes are generally configured to adjust the nonvolatile memory device's performance, such as lowering the formed device's switching currents, lowering the required operating voltage, increasing the operation current ratio (I$_{ON}$/I$_{OFF}$), reducing the device's forming voltage, and reducing the performance variation from one formed device to another. In general, each of the interface layer structures formed in a memory element will have at least one of the following regions: a passivation region, an interface coupling region, and a variable resistance layer interface region, which are discussed further below.

Figure 4A:
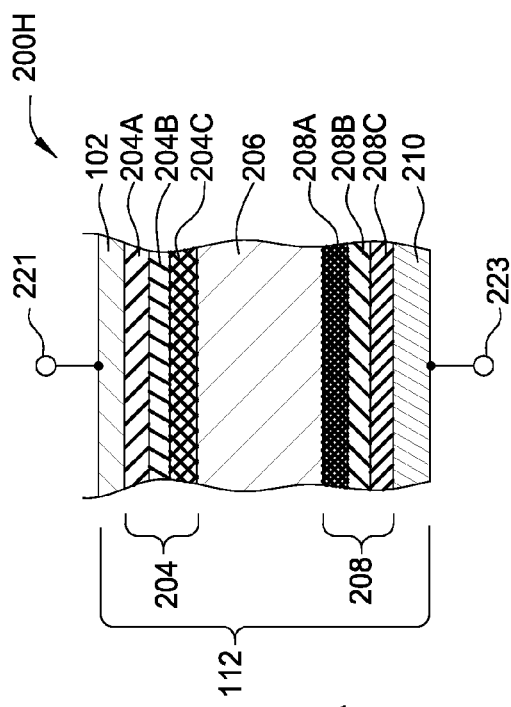
FIG. 4A is a schematic side cross-sectional view of a memory element disposed in a nonvolatile memory device in accordance with an embodiment of the invention.
Figure 5:
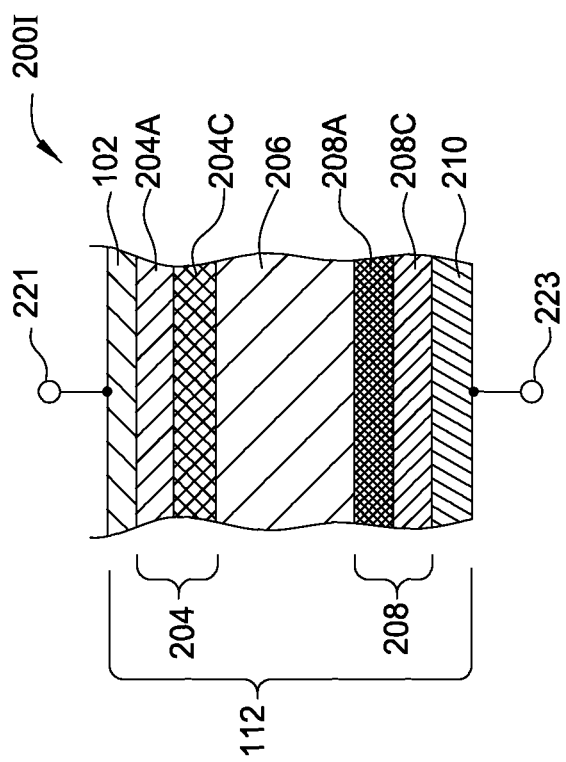
FIG. 5 is a schematic side cross-sectional view of a memory element disposed in a nonvolatile memory device in accordance with an embodiment of the invention.

FIGS. 4A and 5 are schematic side cross-sectional views of a memory element 112 found in a switching memory device, such as switching memory device 200H or switching memory device 200I, that are in accordance with an embodiment of the present invention. FIG. 4A is a schematic side cross-sectional view of a memory element 112 found in a switching memory device 200H, which contains both a first interface structure 204 and a second interface structure 208. In one example, as shown in FIG. 4A, the first interface structure 204 comprises a passivation region 204A, an interface coupling region 204B, and a variable resistance layer (VRL) interface region 204C, and the second interface structure 208 comprises a variable resistance layer interface region 208A, an interface coupling region 208B, and a passivation region 208C.

FIG. 5 is a schematic side cross-sectional view of a memory element 112 found in a switching memory device 200I, which contains both a first interface structure 204 and a second interface structure 208, but does not require interface coupling regions 204B and/or 208B that are found in the switching memory device 200H illustrated in FIG. 4A. Therefore, in one configuration of a switching memory device 200I, the first interface structure 204 comprises a passivation region 204A and a VRL interface region 204C, and the second interface structure 208 comprises a VRL interface region 208A and a passivation region 208C. One will note that while the discussion and illustrations found in FIGS. 4A and 5, include a memory element 112 that has a first interface structure 204 and a second interface structure 208, that this configuration is not intended to be limiting as to the scope of the invention described herein, since as discussed above in conjunction with FIGS. 3B-3C, a memory element 112 may only require one interface structure disposed therein.

The passivation regions, such as passivation regions 204A and 208C, are formed at the interface between an electrode, such as the electrode 102 or the intermediate electrode 210, and the variable resistance layer 206, and are configured to improve the electrical properties at the electrode interface region. In conventionally formed switching memory devices, the interface region formed between the electrode and the variable resistance layer 206 will generally contain many defects that can increase carrier recombination and prevent a good electrical contact from being created between the formed adjacent layers. In general, the amount of carrier recombination is a function of how many dangling bonds (i.e., unterminated chemical bonds) that are present at the interface. These unterminated chemical bonds act as defect traps, which can act as sites for carrier recombination and increase the resistance to the flow of the I$_{ON}$ and I$_{OFF}$ currents through the formed device. Therefore, in one embodiment of the invention, a passivation region 204A and/or a passivation region 208C are formed at the interface between an electrode and the variable resistance layer 206 to passivate the defects found at the interface of the electrode. Since the number of defects can vary from one formed device to the next, and from one region of the substrate on which the device is formed from another, the variability of the device performance can vary from device to device and from one region of the substrate to another. Therefore, by forming a passivation layer at the electrode interface that will reduce the number of interfacial defects and passivate the interface surface, the device performance variability across a formed integrated circuit structure (e.g., array of formed devices) can be greatly reduced. Device to device variability is generally more of an issue when the formed switching memory devices are connected in an array, such as shown in FIG. 2C, since the variability in the required $V_{SET}$ and $V_{RESET}$ values, and associated variations in the $I_{OFF}$ and $I_{ON}$ currents, from device to device can affect when each of the connected devices reliably switch between the "on" and "off" states. In general, the passivation regions 204A and 208C are formed in such a way that the defect density in these regions are less than the defect density at the interface and in the variable resistance layer 206 to assure that the defects in the formed passivation region(s) do not increase carrier recombination. In one example, a low defect density passivation layer is formed by use of an atomic layer deposition (ALD) type of deposition process to control defects and improve switching and forming voltages in some embodiments.

Figure 6B:
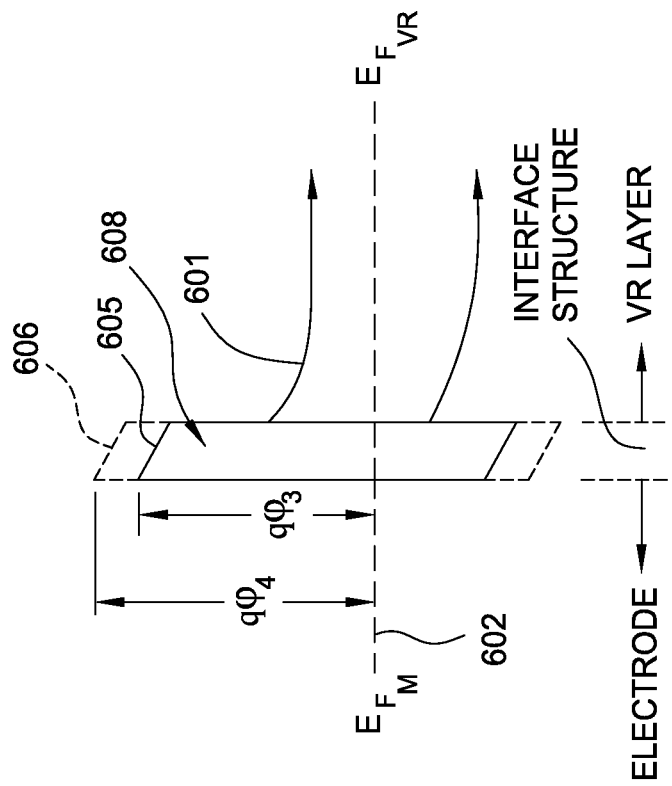
FIG. 6B is a schematic view of a band diagram taken at an electrode interface that has an interface coupling region formed therein in accordance with an embodiment of the invention.
Figure 6A:
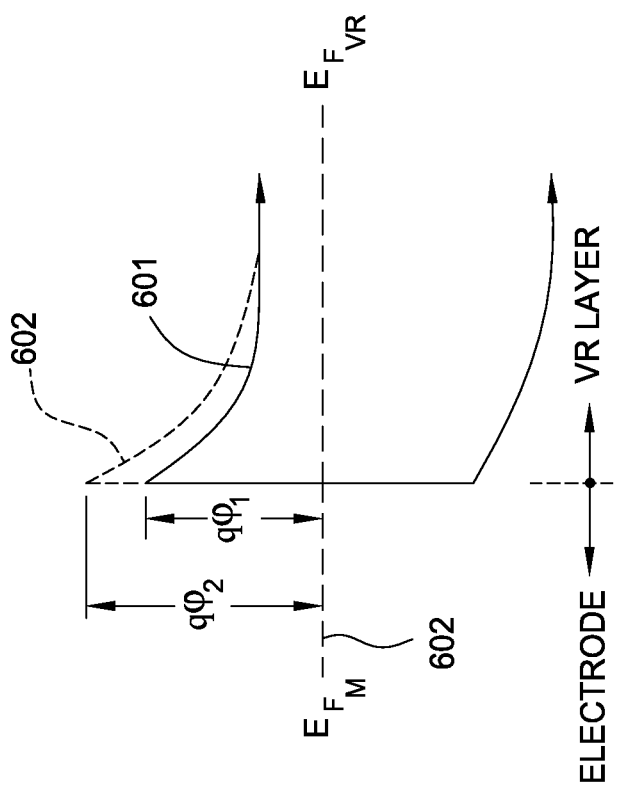
FIG. 6A is a schematic view of a band diagram taken at an electrode interface formed in a memory element in accordance with an embodiment of the invention.

In some configurations, the material disposed in the passivation regions 204A and/or 208C are also selected to adjust the work function of the electrode material, and thus barrier height (e.g., $q\phi_1$ in FIG. 6A) formed at the interface. In this case, by selecting and forming passivation regions 204A and/or 208C that desirably alter the work function of the electrode material, the magnitude of the required $I_{ON}$ and $I_{OFF}$ currents can be adjusted. FIG. 6A schematically illustrates the band structure of an interface formed between an electrode and the dielectric variable resistance layer 206 (e.g., labeled "VR layer" in FIG. 6A), in which a first electrode material is disposed adjacent to a variable resistance layer 206 which causes the bands 601 in the variable resistance layer 206 to naturally bend to form a first barrier height ($q\phi_1$). In one configuration of the memory element 112, the formed passivation region 204A and/or passivation region 208C is used to increase or decrease the formed barrier height at the interface to adjust the ease with which current will flow through the formed interface in the formed device when a voltage is applied across the electrodes. In one configuration, it is desirable to form a passivation region that alters the work function of the electrode material to cause the bands to bend (see band 602) upwards and cause the barrier height to increase from $q\phi_1$ to $q\phi_2$. The increased barrier height will thus tend to reduce the magnitude of the $I_{ON}$ and $I_{OFF}$ current that will flow through the device during operation, due to the increased energy required to move the electrons over and/or tunnel through the barrier and allow the current to flow through the device. One will note that the increase in barrier height will generally not affect the current ratio ($I_{ON}/I_{OFF}$), and thus not affect one's ability to detect the different logic states in the switching memory device. In one embodiment, it may be desirable to further reduce the magnitude of the $I_{ON}$ and $I_{OFF}$ currents by the addition and/or formation of a very thin dielectric layer (e.g., 8-12 Å of oxide) that resides between the formed passivation region 204A, or passivation region 208C, and the variable resistance layer 206, and acts as a tunnel junction to inhibit electron flow.

Since the electrode materials disposed in the electrodes 102 and 210 in the formed memory element 112 may differ, the material used to form the passivation regions 204A and 208C may also be different. As noted above, in one embodiment, the electrode 102 may comprise a metal, such as a transition metal, transition metal alloy, transition metal carbide, transition metal nitride (e.g., TiN), and the intermediate electrode 210 may comprise a heavily doped semiconductor material, such as a heavily doped silicon material (e.g., n-type polysilicon material). Therefore, the material used to form the passivation regions 204A and 208C may be different, and may be formed by different deposition and/or formation processes. In one embodiment, the passivation regions 204A is a metal alloy formed by depositing one or more discrete metal layers and the electrode material layer (e.g., material in electrode 102) in separate processing steps, and then exposing the deposited layers to one or more thermal processing steps to enhance the intermixing and alloying of the two or more layers to form a region that has a desirable work function at the interface of the electrode 102 and the variable resistance layer 206. In one example, the passivation regions 204A and 208C comprise an element selected from a group consisting of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), ruthenium (Ru), and combination thereof.

In one embodiment, the passivation region 208C is a dielectric layer, such as aluminum oxide ($Al_xO_y$), silicon oxide ($Si_xO_y$), silicon nitride ($Si_xN_y$), silicon oxynitride ($Si_xO_yN_z$), or zirconium oxide ($Zr_xO_y$), which is formed on a heavily doped polysilicon type intermediate electrode 210. The dielectric passivation region 208C may be formed by use of a plasma nitridation, plasma oxidation, rapid thermal oxidation, chemical vapor deposition (CVD) or atomic layer deposition (ALD) process. In one example, the passivation region 208C is formed over the surface of the intermediate electrode 210 so that the formed layer will passivate the interface of the electrode and reduce carrier recombination. In one example, the passivation regions 204A and/or 208C comprise a metal or metal oxide materials that is between about 5 and about 30 angstroms (Å) thick.

The VRL interface regions, such as VRL interface region 204C and 208A, may be formed at the interface between the electrode 102, and/or the intermediate electrode 210, and the variable resistance layer 206, and are configured to improve the electrical properties at the interface of the variable resistance layer 206. The VRL interface regions are generally used to improve the switching characteristics of the memory element 112 by doping portions of the variable resistance layer 206. In one configuration, the variable resistance layer 206 is doped with a material that has an affinity for oxygen (e.g., transition metals (Al, Ti, Zr)) to form a metal-rich variable resistance layer (e.g., $HfO_{1.7}$ vs. $HfO_2$), which is deficient in oxygen, and thus has a larger number of oxygen vacancy type defects. The additional vacancy defects can reduce the required switching and forming voltages, reduce the device operating current(s), and reduce the device to device variation in a formed memory element. One will note that a forming voltage is generally applied to the memory element 112 to "burn-in" and configure the variable resistance layer 206 material, so that a more repeatable device performance is achieved throughout memory element's life.

In one embodiment, the VRL interface regions 204C and 208A are formed using a material that has a higher Gibbs energy ($\Delta G$) than material contained in the variable resistance layer 206. The higher Gibbs energy material, used to help form the VRL layer(s), will thus tend to diffuse into, intermix with and/or form an alloy with portions of the material in the variable resistance layer 206 to form the VRL interface regions 204C and/or 208A during the one or more thermal processing steps used to form the switching memory device. Also, the VRL interface region 204C and/or a VRL interface region 208A may be formed at the interface between an electrode and the variable resistance layer 206 to reduce the defect contained on the variable resistance layer 206 side of the interface, and thus improve the electrical properties of the formed interface. In one example, the VRL interface regions 204C and 208A comprises the material from which the variable resistance layer 206 is formed (e.g., $HfO_x$) with a dopant atom selected from a group consisting of aluminum, zirconium, titanium, tungsten, tantalum, cobalt, molybdenum, nickel, vanadium, copper, platinum, palladium, iridium, hafnium, and ruthenium disposed therein. In one example, the VRL interface regions 204C and/or 208A are between about 5 and about 30 angstroms (Å) thick. In one configuration, the dopant atom comprises an element that is different than the element from which the electrodes are substantially formed.

Also, in some configurations of the memory element 112, the first interface structure 204 or second interface structure 208, such as the passivation regions 204A, 208C, interface coupling regions 204B, 208B or VRL interface regions 204C, 208A, have a desirable thickness so that they will act as a diffusion barrier that prevents the diffusion of the material found in the electrodes 102, 210, and 118 from diffusing into the variable resistance layer 206, or vice versa, during a thermal processing step used to form the memory element 112. Moreover, it is often desirable for the materials in the first interface structure 204 or second interface structure 208 to preferentially diffuse into and/or at least partially intermix with the material in the electrodes and the variable resistance layer.

In one embodiment, as shown in FIG. 4A, the memory element 112 comprises one or more interface coupling regions, such as interface coupling regions 204B and 208B, which are formed between an electrode (e.g., electrode 102 or intermediate electrode 210) and the variable resistance layer 206. The interface coupling region(s) are configured to improve the electrical properties of a formed switching memory device by lowering the current that will flow through the device, while not affecting the current ratio ($I_{ON}/I_{OFF}$), and thus ability to detect the different logic states in the switching memory device. An interface coupling region is formed from a material that has a desirable band gap and thickness so that when it is disposed between the electrode and the variable resistance layer 206 it will tend to block or inhibit current flow through the memory element 112. FIG. 6B schematically illustrates the band structure of an interface formed between an electrode and the dielectric variable resistance layer 206 (e.g., labeled "VR layer" in FIG. 6B), in which an interface coupling region is disposed between an electrode and a variable resistance layer 206, which forms a blocking region 608 that inhibits the flow of current in either direction through the formed interface due to the presence of the interface coupling region. In one embodiment, the material disposed in the interface coupling region has a band gap that is larger than the material found in the variable resistance layer 206. In one configuration, the variable resistance layer 206 is a hafnium oxide ($Hf_xO_y$) material and the interface coupling region is formed from a material selected from a group of zirconium oxide ($Zr_xO_y$), tantalum oxide ($Ta_xO_y$), aluminum oxide ($Al_xO_y$), yttrium oxide ($Y_xO_y$), dysprosium oxide ($Dy_xO_y$), and ytterbium oxide ($Yb_xO_y$). The presence of the interface coupling region will naturally form a barrier height ($q\phi_3$) at the interface between the electrode and the interface coupling region. The size of the barrier height ($q\phi_3$) is strongly dependent on the band gap of the material used to form the interface coupling region and the material from which the electrode is formed. One will note that in some cases it is desirable to form a passivation region (e.g., region 204A) between the electrode (e.g., electrode 102) and the interface coupling layer (e.g., region 204B) to further modify and adjust the formed barrier height formed at the interface, such as varying the barrier height from $q\phi_3$ to $q\phi_4$. The adjusted barrier height will thus tend to adjust the magnitude of the $I_{ON}$ and $I_{OFF}$ current that can flow through the device during operation, while not affecting the current ratio ($I_{ON}/I_{OFF}$), and thus one's ability to detect the different logic states in the switching memory device.

In one configuration of the memory element 112, an interface coupling region 204B and/or an interface coupling region 208B are formed so that it has a desirable thickness to help further adjust the ease with which current can flow through the formed interface in the formed device. By adjusting the thickness of the interface coupling region, the current flow through the memory element can be adjusted, since a sufficiently thin interface coupling region can allow tunneling currents to become an important factor in the amount of current that flows through the formed interface coupling region and memory element 112. In one embodiment, an interface coupling region formed from one of the materials discussed above has a thickness less than about 30 angstroms (Å), such as between about 5 and about 30 Å.

Figure 6C:
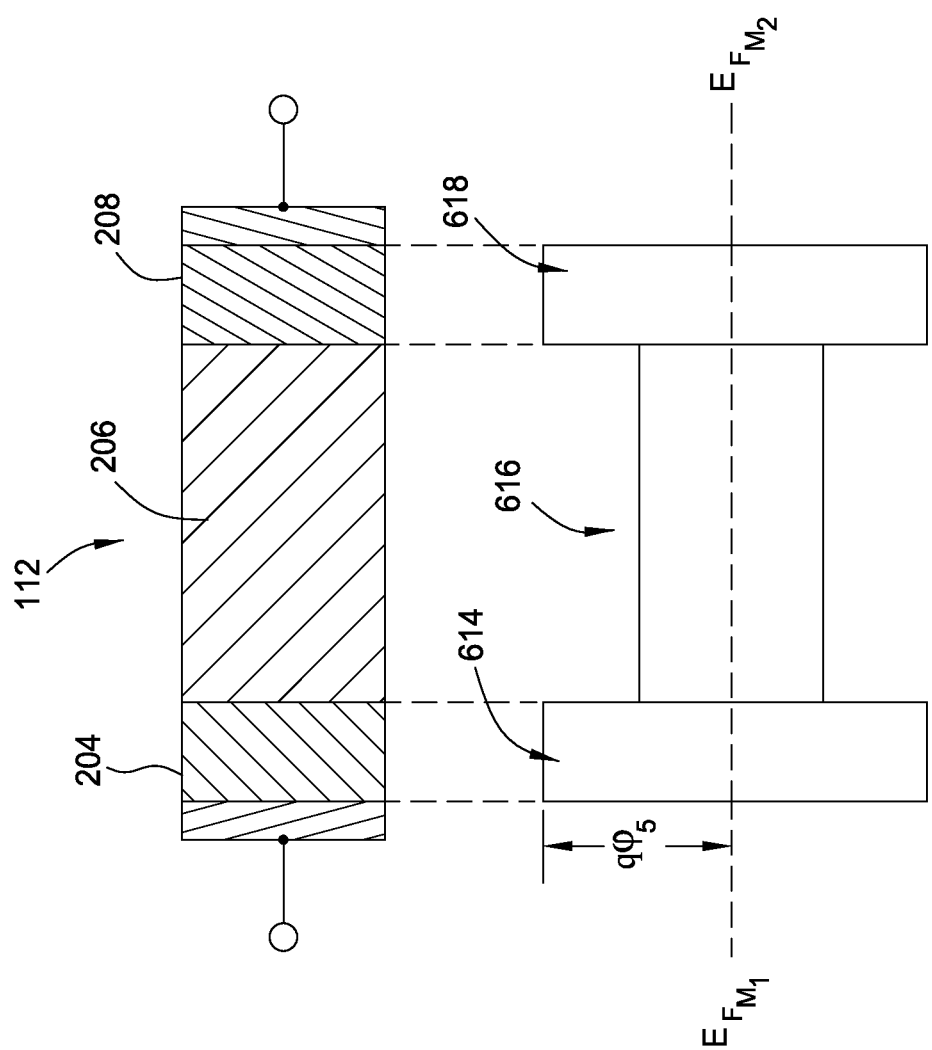
FIG. 6C is a schematic view of a band diagram taken across a memory element in accordance with an embodiment of the invention.

FIG. 6C schematically illustrates the band structure of the memory element 112, which is similar to the switching memory device 200H illustrated in FIG. 4A, that has a first interface structure 204 and the second interface structure 208 that are disposed between the variable resistance layer 206 and their respective electrodes. In one embodiment, the first and second interface structures 204 and 208 each comprise a material that has a band gap larger than the variable resistance layer 206 material, and thus both tend to reduce the magnitude of the $I_{ON}$ and $I_{OFF}$ current that can flow through the device during operation, while not affecting the current ratio ($I_{ON}/I_{OFF}$), and thus one's ability to detect the different logic states in the switching memory device. In one example, as illustrated in FIG. 6C, the first interface structure 204 comprises one or more layers of a dielectric material that has a band structure 614, the variable resistance layer 206 comprises a dielectric material that has a band structure 616, and the second interface structure 208 comprises one or more layers of a dielectric material that has a band structure 618.

Figure 4C:
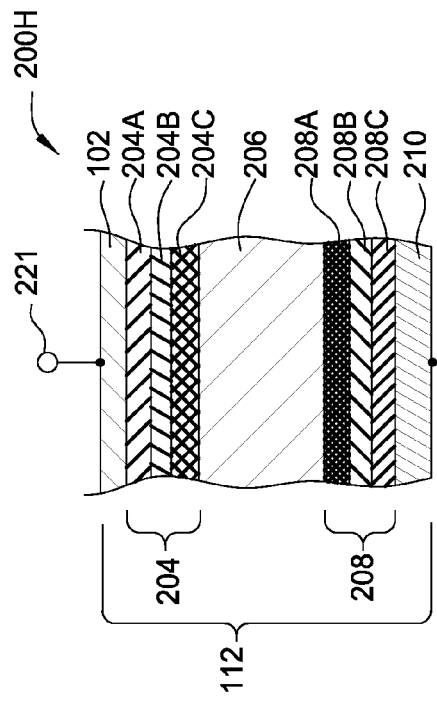
FIGS. 4B-4C are schematic side cross-sectional views of various stages of the formation of a memory element in accordance with an embodiment of the invention.
Figure 4B:
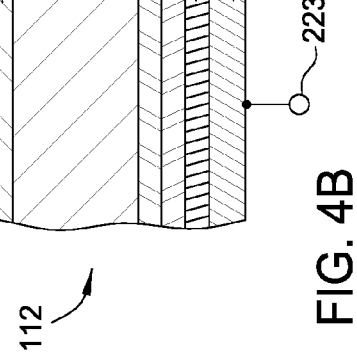
Figure 7:
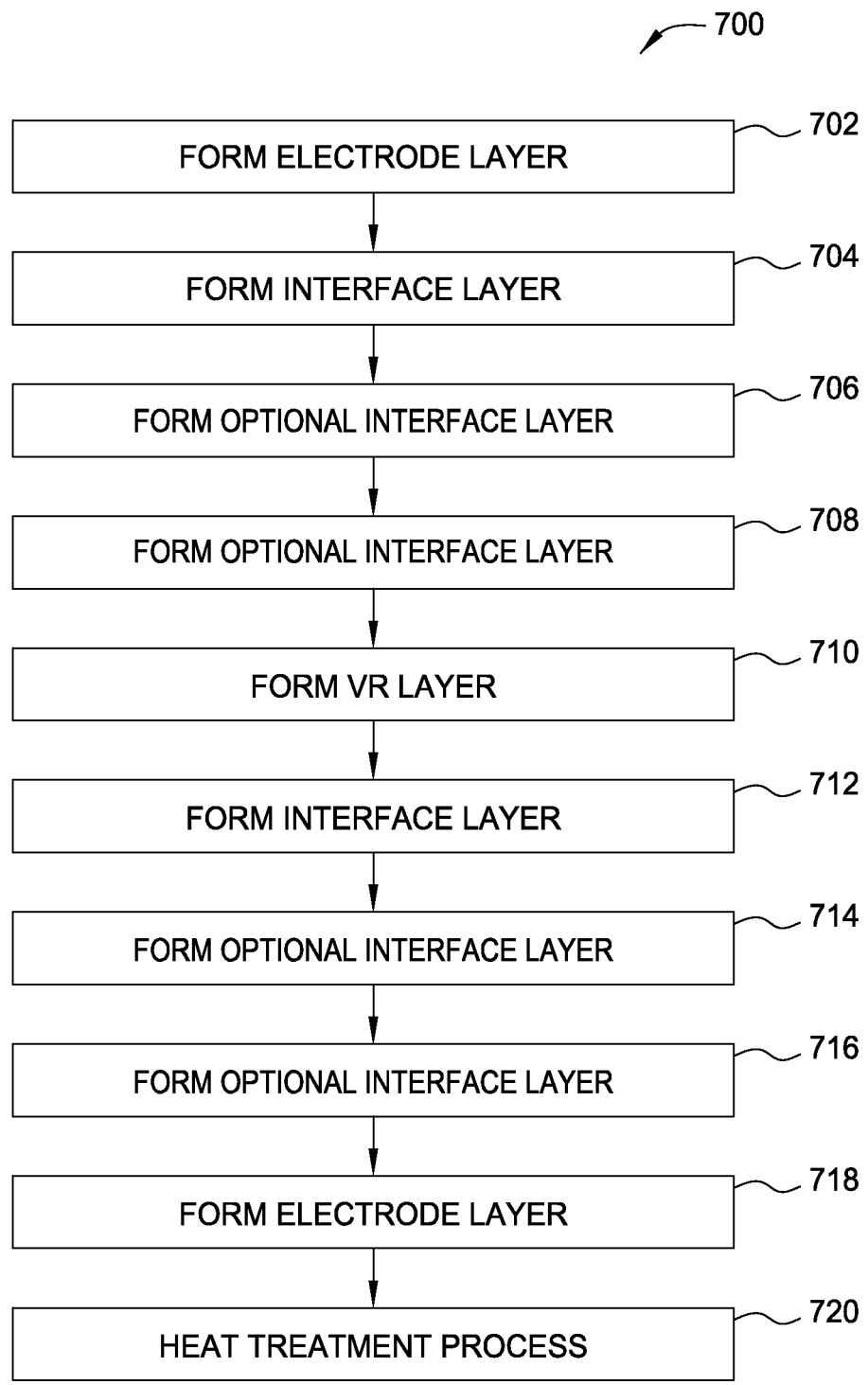
FIG. 7 is a schematic depiction of a process for forming the switching memory device according to one embodiment of the invention.

FIGS. 4B and 4C are schematic cross-sectional views of a memory element that illustrate different stages of a memory element formation process in which the first interface structure 204 and the second interface structure 208 are formed. FIG. 7 is a schematic depiction of a process sequence 700 that may be used to form the switching memory device 200H illustrated in FIGS. 4A and 4C, according to one embodiment of the invention. FIG. 4B illustrates an intermediate stage of forming a switching memory device, or switching memory device 200G, that contains a series of stacked discrete layers including an electrode 102, interface layer 201, interface layer 203, interface layer 205, variable resistance layer 206, interface layer 207, interface layer 209, interface layer 211 and intermediate electrode 210 that are formed one on top of each other by use of the processing sequence, such as processing sequence 700 discussed below. FIG. 4C illustrates the final formed switching memory device 200H that contains the formed electrode 102, first interface structure 204, variable resistance layer 206, second interface structure 208, and intermediate electrode 210, which are formed by performing one or more subsequent processing steps, such as one or more thermal processing steps. The subsequent processing steps are often used to heat treat or activate dopants in one or more of the layers disposed in the formed device (e.g., current steering elements) or other devices formed on the chip.

Referring to FIGS. 4B and 7, at step 702 an intermediate electrode 210 is formed over a substrate or provided for further processing. In one embodiment, the intermediate electrode 210 is a highly doped polysilicon layer that is formed using a conventional CVD or ALD type polysilicon deposition technique. In some cases, an optional native oxide layer removal step may be performed after forming the intermediate electrode layer 210 by use of a wet chemical processing technique, or conventional dry clean process that is performed in a plasma processing chamber. It should be noted that although only the intermediate electrode 210 is depicted in FIG. 4B, the intermediate electrode 210 may be provided on a substrate (i.e., substrate 201 shown in FIG. 3A) that may have the steering device 216 and the electrode 218 formed thereon as well. Alternatively, in the case where no steering device 216 is provided, the depicted intermediate electrode 210 is the electrode 218. In one example, the intermediate electrode 210 comprises polysilicon and is between about 50 and about 5000 angstroms (Å) thick.

At step 704, as depicted in FIGS. 4B and 7, an interface layer 211 is formed on the intermediate electrode 210 using a deposition process, such as a PVD, CVD (e.g., LPCVD, PECVD), ALD (e.g., PEALD) or other similar process. In one embodiment, the interface layer 211 is a metal oxide layer (e.g., $Al_2O_3$, $ZrO_2$) that is formed by use of a CVD or ALD process in which a metal precursor and an oxygen containing gas is provided over the surface of the substrate. In one example, the interface layer 211 may be formed to a thickness between about 3 and about 10 angstroms (Å), and comprise a material such as $Al_2O_3$ or $ZrO_2$. In another embodiment of step 704, the interface layer 211 is formed on the intermediate electrode 210 by performing a nitridation and/or oxidation process to form a SiON interface layer on a polysilicon type intermediate electrode 210. In one example of a nitridation and/or oxidation process, the interface layer 211 is annealed and/or exposed to an RF plasma in a nitrogen environment, such as $NH_3$, $N_2O$, NO, or the like. In one example, the partially formed device 200 is heated to a temperature between about 600 and about 800° C. at a pressure of less than about 100 Torr for a time period between about 1 second and about 120 seconds to form a SiON interface layer 211.

At step 706, as depicted in FIGS. 4B and 7, a first optional interface layer 209 is formed over the interface layer 211 using a deposition process, such as a PVD, CVD, ALD or other similar process. In one embodiment, the interface layer 209 is a metal oxide layer (e.g., $Al_2O_3$, $ZrO_2$) or metal layer (e.g., Al, Ti, Zr, Ni) that is formed by use of a PVD, CVD or ALD process. In one configuration, the first optional interface layer comprises a material that is different, or has different material properties, from the interface layer 211. The first optional interface layer 209 may be used to form at least part of a passivation region, an interface coupling region and/or a VRL interface region in a formed switching memory device. In one example, an ALD process using tetrakis(dimethylamino)zirconium (TDMAZ) and an oxygen containing precursor (e.g., ozone, room temperature water ($H_2O$)) at a temperature of about 200-300° C. is used to form an 8 Angstrom (Å) thick zirconium oxide ($ZrO_x$) containing interface layer 211. In one example, a PVD process is used to deposit an aluminum (Al) layer that is then treated with ozone ($O_3$) at a temperature of about 100-300° C. to form a 20 Å thick aluminum oxide ($Al_xO_y$) containing interface layer 211. In one example, an ALD process using trimethylaluminium (TMA) and an oxygen containing precursor at a temperature of about 200-300° C. to form an 8 Å thick aluminum oxide ($Al_xO_y$) containing interface layer 211.

At step 708, as depicted in FIGS. 4B and 7, a second optional interface layer 207 is formed over the first optional interface layer 209 using a deposition process, such as a PVD, CVD, ALD or other similar process. In one embodiment, the interface layer 207 is a metal oxide layer (e.g., $Al_2O_3$, $ZrO_2$) or metal layer (e.g., Al, Ti, Zr, Ni) that is formed by use of a PVD, CVD or ALD process. In one example, the interface layer 207 may be formed to a thickness between about 3 and about 10 angstroms, and comprise a material such as Al, Ti, Ni or Zr. In one configuration, the second optional interface layer comprises a material that is different from the first optional interface layer 209. One will note that, in some configurations, it may be desirable to form one or more additional interface layers that each comprise different materials, or have different material properties, over the interface layer 207 to help tailor the electrical and mechanical characteristics of the interface structure that is to be formed in the switching memory device. In this configuration, step 708 may be performed multiple times to form a desirable number of layers that each comprise different materials, or have different material properties. The second optional interface layer 207 may be used to form at least part of an interface coupling region and/or a VRL interface region in a formed switching memory device. In one example, an ALD process using TMA and an oxygen containing precursor at a temperature of about 200-300° C. is used to form an 8 Å thick aluminum oxide ($Al_xO_y$) containing interface layer 209.

Referring to FIGS. 4B and 7, at step 710, the variable resistance layer 206 is deposited on the interface layer 208 using a deposition process. The variable resistance layer 206 may comprise a metal oxide layer, such as $Hf_xO_y$, $Ta_xO_y$, $Al_xO_y$, $La_xO_y$, $Y_xO_y$, $Dy_xO_y$, $Yb_xO_y$, and/or $Zr_xO_y$, formed to a thickness of between about 20 and about 100 angstroms (Å), such as between about 30 and about 50 angstroms (Å). The variable resistance layer 206 can be deposited using any desired technique, but in some embodiments described herein is deposited using an ALD process. In other embodiments, the variable resistance layer 206 can be deposited using a CVD (e.g., LPCVD, PECVD) or ALD (e.g., PEALD), physical vapor deposition (PVD), liquid deposition processes, and epitaxy processes. It is believed that PEALD processes can be used to control defects and improve switching and forming voltages in some embodiments. In one example, an ALD process using tetrakis(dimethylamino)hafnium (TDMAH) and an oxygen containing precursor at a temperature of about 250° C. is used to form an 50 Å thick hafnium oxide ($Hf_xO_y$) containing variable resistance layer 206.

At step 712, as depicted in FIGS. 4B and 7, an interface layer 205 is formed over the variable resistance layer 206 using a deposition process, such as a PVD, CVD, ALD or other similar process. In one embodiment, the interface layer 205 is a metal oxide layer (e.g., $Al_2O_3$, $ZrO_2$) or metal layer (e.g., Al, Ti, Zr, Ni) that is formed by use of a PVD, CVD or ALD process. In one example, an ALD process using TMA and an oxygen containing precursor at a temperature of about 200-300° C. is used to form an 8 Å thick aluminum oxide ($Al_xO_y$) containing interface layer 206. In one example, the interface layer 203 may be formed to a thickness between about 3 and about 10 angstroms, and comprise a material such as Al, Ti, Ni or Zr. The interface layer 205 may be used to form at least part of a VRL interface region, an interface coupling region and/or a passivation region in a formed switching memory device.

At step 714, as depicted in FIGS. 4B and 7, a third optional interface layer 203 is formed over the interface layer 205 using a deposition process, such as a PVD, CVD, ALD or other similar process. In one embodiment, the interface layer 203 is a metal oxide layer (e.g., $Al_2O_3$, $ZrO_2$) or metal layer (e.g., Al, Ti, Zr, Ni) that is formed by use of a PVD, CVD or ALD process. In one configuration, the third optional interface layer 203 comprises a material that is different, or have different material properties, from the interface layer 205. The third optional interface layer 203 may be used to form at least part of a VRL interface region, an interface coupling region and/or a passivation region in a formed switching memory device. In one example, a PVD process is used to deposit an aluminum (Al) layer at a temperature of about 100-300° C. to form a 20 Å thick aluminum (Al) interface layer 203.

At step 716, as depicted in FIGS. 4B and 7, a fourth optional interface layer 201 is formed over the third interface layer 203 using a deposition process, such as a PVD, CVD, ALD or other similar process. In one embodiment, the fourth optional interface layer 201 is a metal oxide layer (e.g., $Al_2O_3$, $ZrO_2$) or metal layer (e.g., Al, Ti, Zr, Ni) that is formed by use of a PVD, CVD or ALD process. In one configuration, the fourth optional interface layer 201 comprises a material that is different from the third interface layer 203. One will note that, in some configurations, it may be desirable to form one or more additional interface layers that each comprise different materials, or have different material properties, over the fourth interface layer 201 to help tailor the electrical and mechanical characteristics of the interface structure that is to be formed in the switching memory device. In this configuration, step 716 may be performed multiple times to form a desirable number of layers that each comprise different materials, or have material properties. In one example, the fourth interface layer may comprise a material selected from a group consisting of aluminum, titanium, tungsten, tantalum, cobalt, molybdenum, nickel, vanadium, copper, platinum, palladium, iridium, and ruthenium. In another example, the fourth interface layer may comprise a material selected from a group consisting of tantalum, aluminum, lanthanum, yttrium, dysprosium, ytterbium and zirconium. The interface layer 201 may be used to form at least part of an interface coupling region and/or a passivation region in a formed switching memory device.

At step 718, the electrode 102 is formed on the interface layer 201 as shown in FIG. 4B and using one or more of the materials that are discussed above. The electrode 102 layer may be deposited using a deposition process, such as a PVD, CVD, ALD or other similar process. In one example, the electrode layer 102 is between about 500 Å and 1 µm thick.

At step 720, the formed switching memory device 200G is annealed at a temperature of greater than about 550° C. In one example, the formed switching memory device 200G is annealed at a temperature of greater than about 700° C. In another example, the formed switching memory device 200G is annealed at a temperature of between about 550° C. and about 1000° C. for a period of time between about 30 seconds and about 20 minutes. In one example, the device is annealed using a hydrogen/argon mixture (e.g., 2-10% hydrogen, 90-98% argon), although other anneals such as vacuum anneals, oxidizing anneals, etc. can be used. In one example, the annealing process is performed at a temperature of about 750° C. for about 1 minute in a forming gas environment maintained at a pressure of about 760 Torr. In another example of an annealing process, the formed device is heated to a temperature of about 750° C. for about 1 minute in an oxygen rich forming gas environment, wherein the processing environment comprises between about 0.5 and 10% of oxygen, between about 2 and 6% of hydrogen, between about 10 and 97.5% of nitrogen, and optionally the remaining percentage being a carrier gas (e.g., argon), and the environment is maintained at a pressure of between about 0.5 and 100 Torr. The process(es) performed at step 720, are generally configured to cause the layers disposed in the switching memory device 200G (FIG. 4B) to form the various regions (e.g., regions 204A, 204B, and/or 204C) in the first interface layer 204 and the various regions (e.g., regions 208A, 208B and/or 208C) in the second interface layer 208, as well as activate and or desirably process the other layers formed in the switching memory device.

In some embodiments of the invention, multiple thermal processing steps, such as described in step 720, are performed during the processing sequence 700, rather than performing just one thermal process (step 720) at the end of the processing sequence. In one example, a thermal process may be performed during or after each step, during or after every other step or in any other sequence that is desirable to form the switching memory device 200H. In some embodiments of the invention, the thermal processing steps are performed during part of the one or more deposition process steps found in the processing sequence 700, rather than just performing one thermal process at the end of the processing sequence.

Process and Device Examples

In one example of a process of forming a switching memory device, after performing the steps 702-718 in the processing sequence 700, a memory element 112 is formed that comprises: an intermediate electrode 210 comprising an n-doped polysilicon layer, an interface layer 211 that is between about 8 Å-20 Å thick and comprises aluminum oxide ($Al_2O_3$), an interface layer 209 that is about 50 Å thick and comprises zirconium oxide ($ZrO_x$), an interface layer 207 that is about 50 Å thick and comprises aluminum (Al), a variable resistance layer 206 that is about 50 Å thick and comprises hafnium oxide ($HfO_x$), an interface layer 205 that is between about 8 Å-20 Å thick and comprises aluminum oxide ($Al_2O_3$), an interface layer 203 that is about 50 Å thick and comprises zirconium oxide ($ZrO_x$), an interface layer 201 that is about 50 Å thick and comprises aluminum (Al), and an electrode 102 that comprises a layer of titanium nitride (TiN). After forming the switching memory device 200G (FIG. 4B), then at least one thermal processing step is performed, such as step 720, to form switching memory device 200H (FIG. 4C) comprises: an intermediate electrode 210 comprising an n-doped polysilicon layer, a passivation region 208C that is between about 8 Å-20 Å thick and comprises aluminum oxide ($Al_2O_3$), an interface coupling region 208B that is about 50 Å thick and comprises zirconium oxide ($ZrO_x$), a VRL interface region 208A that is about 5 Å thick and comprises hafnium aluminum oxide ($Hf_xAl_yO_z$), a variable resistance layer 206 that is about 30 Å thick and comprises hafnium oxide ($HfO_x$), a VRL interface region 204C that is about 5 Å thick and comprises hafnium aluminum oxide ($Hf_xAl_yO_z$), an interface coupling region 204B that is about 50 Å thick and comprises zirconium oxide ($ZrO_x$), a passivation region 204A that is between about 5 Å thick and comprises titanium aluminum nitride ($Ti_xAl_yN_z$), and an electrode 102 that comprises a titanium nitride (TiN) layer.

In another exemplary process of forming the switching memory device, after performing the steps 702-706, 710-714 and 718, a memory element 112 is formed that comprises: an intermediate electrode 210 comprising an n-doped polysilicon layer, an interface layer 211 that is between about 8 Å-20 Å thick and comprises aluminum oxide ($Al_2O_3$), an interface layer 209 that is about 50 Å thick and comprises aluminum (Al), a variable resistance layer 206 that is about 50 Å thick and comprises hafnium oxide ($HfO_x$), an interface layer 205 that is between about 8 Å-20 Å thick and comprises aluminum oxide ($Al_2O_3$), an interface layer 203 that is about 50 Å thick and comprises aluminum (Al), and an electrode 102 that comprises a layer of titanium nitride (TiN). Next, after performing at least one thermal processing step, such as step 720, the formed switching memory device will generally comprise: an intermediate electrode 210 comprising an n-doped polysilicon layer, a passivation region 208C that is between about 8 Å-20 Å thick and comprises aluminum oxide ($Al_2O_3$), a VRL interface region 208A that is about 8 Å thick and comprises hafnium aluminum oxide ($Hf_xAl_yO_z$), a variable resistance layer 206 that is about 30 Å thick and comprises hafnium oxide ($HfO_x$), a VRL interface region 204C that is about 8 Å thick and comprises hafnium aluminum oxide ($Hf_xAl_yO_z$), a passivation region 204A that is about 10 Å thick and comprises titanium aluminum nitride ($Ti_xAl_yN_z$), and an electrode 102 that comprises a titanium nitride (TiN) layer.

In yet another exemplary process of forming the switching memory device, after performing the steps 702, 710-714 and 718, a memory element 112 is formed that comprises: an intermediate electrode 210 comprising an n-doped polysilicon layer, a variable resistance layer 206 that is about 50 Å thick and comprises hafnium oxide ($HfO_x$), an interface layer 205 that is between about 8 Å-20 Å thick and comprises aluminum oxide ($Al_2O_3$), an interface layer 203 that is about 50 Å thick and comprises aluminum (Al), and an electrode 102 that comprises a layer of titanium nitride (TiN). Next, after performing at least one thermal processing step, such as step 720, the formed switching memory device will generally comprise: an intermediate electrode 210 comprising an n-doped polysilicon layer, a variable resistance layer 206 that is about 50 Å thick and comprises hafnium oxide ($HfO_x$), a VRL interface region 204C that is about 20 Å thick and comprises hafnium aluminum oxide ($Hf_xAl_yO_z$), a passivation region 204A that is about 10 Å thick and comprises titanium aluminum nitride ($Ti_xAl_yN_z$), and an electrode 102 that comprises titanium nitride (TiN) layer.

In yet another exemplary process of forming the switching memory device, after performing the steps 702-706, 710 and 718, a memory element 112 is formed that comprises: an intermediate electrode 210 comprising an n-doped polysilicon layer, an interface layer 211 that is between about 8 Å-20 Å thick and comprises aluminum oxide ($Al_2O_3$), an interface layer 209 that is about 50 Å thick and comprises aluminum (Al), a variable resistance layer 206 that is about 50 Å thick and comprises hafnium oxide ($HfO_x$), and an electrode 102 that comprises a layer of titanium nitride (TiN). Next, after performing at least one thermal processing step, such as step 720, the formed switching memory device will generally comprise: an intermediate electrode 210 comprising an n-doped polysilicon layer, a passivation region 208C that is between about 8 Å-20 Å thick and comprises aluminum oxide ($Al_2O_3$), a VRL interface region 208A that is about 10 Å thick and comprises hafnium aluminum oxide ($Hf_xAl_yO_z$), a variable resistance layer 206 that is about 30 Å thick and comprises hafnium oxide ($HfO_x$), and an electrode 102 that comprises a titanium nitride (TiN) layer.

In yet another exemplary process of forming the switching memory device, after performing the steps 702-706, 710 and 718, a memory element 112 is formed that comprises: an intermediate electrode 210 comprising an n-doped polysilicon layer, an interface layer 211 that is between about 8 Å-20 Å thick and comprises silicon dioxide ($SiO_2$), an interface layer 209 that is about 8 Å-20 Å thick and comprises aluminum oxide ($Al_2O_3$), a variable resistance layer 206 that is about 50 Å thick and comprises hafnium oxide ($HfO_x$), and an electrode 102 that comprises titanium nitride (TiN). Next, after performing at least one thermal processing step, such as step 720, the formed switching memory device will generally comprise: an intermediate electrode 210 comprising an n-doped polysilicon layer, a passivation region 208C that is between about 8 Å-20 Å thick and comprises silicon dioxide ($SiO_2$), an interface coupling region 208B that is about 8 Å-20 Å thick and comprises aluminum oxide ($Al_2O_3$), a VRL interface region 208A that is about 10 Å thick and comprises hafnium aluminum oxide ($Hf_xAl_yO_z$), a variable resistance layer 206 that is about 30 Å thick and comprises hafnium oxide ($HfO_x$), and an electrode 102 that comprises a titanium nitride (TiN).

In yet another exemplary process of forming the switching memory device, after performing the steps 702 and 710-718, a memory element 112 is formed that comprises: an intermediate electrode 210 comprising an n-doped polysilicon layer, a variable resistance layer 206 that is about 50 Å thick and comprises hafnium oxide ($HfO_x$), an interface layer 205 that is between about 8 Å-20 Å thick and comprises aluminum oxide ($Al_2O_3$), an interface layer 203 that is between about 8 Å-20 Å thick and comprises zirconium oxide ($ZrO_x$), an interface layer 201 that is about 50 Å thick and comprises aluminum (Al), and an electrode 102 that comprises titanium nitride (TiN). Next, after performing at least one thermal processing step, such as step 720, the formed switching memory device will generally comprise: an intermediate electrode 210 comprising an n-doped polysilicon layer, a variable resistance layer 206 that is about 30 Å thick and comprises hafnium oxide ($HfO_x$), a VRL interface region 204C that is about 15 Å thick and comprises hafnium aluminum oxide ($Hf_xAl_yO_z$), an interface coupling region 204B that is about 8 Å-20 Å thick and comprises zirconium oxide ($ZrO_x$), a passivation region 204A that is between about 15 Å thick and comprises titanium aluminum nitride ($Ti_xAl_yN_z$), and an electrode 102 that comprises a titanium nitride (TiN) layer.

In yet another exemplary process of forming the switching memory device, after performing the steps 702 and 710-718, a memory element 112 is formed that comprises: an intermediate electrode 210 comprising an n-doped polysilicon layer, a variable resistance layer 206 that is about 50 Å thick and comprises hafnium oxide ($HfO_x$), an interface layer 205 that is between about 8 Å-20 Å thick and comprises aluminum oxide ($Al_2O_3$), and an electrode 102 that comprises titanium nitride (TiN). Next, after performing at least one thermal processing step, such as step 720, the formed switching memory device will generally comprise: an intermediate electrode 210 comprising an n-doped polysilicon layer, a variable resistance layer 206 that is about 50 Å thick and comprises hafnium oxide ($HfO_x$), a VRL interface region 204C that is about 15 Å thick and comprises hafnium aluminum oxide ($Hf_xAl_yO_z$), an interface coupling region 204B that is about 8 Å-20 Å thick and comprises aluminum oxide ($Al_2O_3$), a passivation region 204A that is between about 15 Å thick and comprises titanium aluminum nitride ($Ti_xAl_yN_z$), and an electrode 102 that comprises a titanium nitride (TiN) layer.

The foregoing is merely illustrative of the principles of this invention and various modifications can be made by those skilled in the art without departing from the scope and spirit of the invention as defined by the claims that follow.

What is claimed is:
1. A nonvolatile memory element, comprising:
a first electrode layer;
a second electrode layer;
a variable resistance layer disposed between the first electrode layer and the second electrode layer; and
a first interface layer disposed between the first electrode layer and the variable resistance layer, wherein the first interface layer comprises:
a first passivation region disposed adjacent to the first electrode; and
a first variable resistance interface region disposed adjacent to the variable resistance layer;

wherein the Gibbs energy of the material in the first passivation region is greater than the Gibbs energy of the material in the variable resistance layer.

2. The nonvolatile memory element of claim 1, wherein
the first electrode layer comprises a first material selected from a group consisting of titanium, aluminum, tungsten, tantalum, cobalt, molybdenum, nickel, vanadium, copper, platinum, palladium, iridium and ruthenium, and the first passivation region comprises the first material found in the first electrode layer and a second material selected from a group consisting of titanium, aluminum, tungsten, tantalum, cobalt, molybdenum, nickel, vanadium, copper, platinum, palladium, iridium, and ruthenium, wherein the first material and the second material are different materials.

3. The nonvolatile memory element of claim 1, wherein the variable resistance layer comprises hafnium oxide, tantalum oxide, aluminum oxide, lanthanum oxide, yttrium oxide, dysprosium oxide, ytterbium oxide or zirconium oxide.

4. The nonvolatile memory element of claim 1, wherein
the variable resistance layer comprises a first material selected from a group consisting of hafnium, tantalum, aluminum, lanthanum, yttrium, dysprosium, ytterbium and zirconium, and the first variable resistance interface region comprises the first material found in the variable resistance layer and a second material selected from a group consisting of aluminum, titanium, tungsten, tantalum, cobalt, molybdenum, nickel, vanadium, copper, platinum, palladium, iridium and ruthenium.

5. The nonvolatile memory element of claim 1, wherein
the first passivation region comprises a material selected from a group consisting of aluminum oxide, silicon oxide, silicon nitride, silicon oxynitride and zirconium oxide, the variable resistance layer comprises hafnium oxide, and
the first variable resistance interface region comprises hafnium and a material selected from a group containing aluminum and zirconium.

6. A nonvolatile memory element, comprising:
a first electrode layer;
a second electrode layer;
a variable resistance layer disposed between the first electrode layer and the second electrode layer;
a first interface layer disposed between the first electrode layer and the variable resistance layer, wherein the first interface layer comprises:
a first passivation region disposed adjacent to the first electrode layer; and
a first variable resistance interface region disposed adjacent to the variable resistance layer; and a second interface layer disposed between the second electrode layer and the variable resistance layer, wherein the second interface layer comprises:
a second passivation region disposed adjacent to the second electrode layer; and
a second variable resistance interface region disposed adjacent to the variable resistance layer.

7. The nonvolatile memory element of claim 6, wherein
the first electrode layer comprises a first material selected from a group consisting of titanium, aluminum, tungsten, tantalum, cobalt, molybdenum, nickel, vanadium, copper, platinum, palladium, iridium and ruthenium, and the first passivation region comprises the first material found in the first electrode layer and a second material selected from a group consisting of titanium, aluminum, tungsten, tantalum, cobalt, molybdenum, nickel, vanadium, copper, platinum, palladium, iridium, and ruthenium, wherein the first material and the second material are different materials.

8. The nonvolatile memory element of claim 6, wherein the variable resistance layer comprises hafnium oxide, tantalum oxide, aluminum oxide, lanthanum oxide, yttrium oxide, dysprosium oxide, ytterbium oxide or zirconium oxide.

9. The nonvolatile memory element of claim 6, wherein the work function of the material in the first passivation region is greater than the work function of the material in the first electrode layer, or the work function of the material in the second passivation region is greater than the work function of the material in the second electrode layer.

10. The nonvolatile memory element of claim 6, wherein
the variable resistance layer comprises a first material selected from a group consisting of hafnium, tantalum, aluminum, lanthanum, yttrium, dysprosium, ytterbium and zirconium, and the first variable resistance interface region, or the second variable resistance interface region, comprise the first material found in the variable resistance layer and a second material selected from a group consisting of aluminum, titanium, tungsten, tantalum, cobalt, molybdenum, nickel, vanadium, copper, platinum, palladium, iridium and ruthenium.

11. The nonvolatile memory element of claim 6, wherein
the first passivation region comprises a material selected from a group consisting of aluminum oxide, silicon oxide, silicon nitride, silicon oxynitride and zirconium oxide, the first electrode comprises silicon;
the variable resistance layer comprises hafnium oxide, and
the first variable resistance interface region comprises hafnium and a material selected from a group containing aluminum and zirconium.

\* \* \* \* \*